(12) United States Patent
Bothor et al.

(10) Patent No.: US 12,016,140 B2
(45) Date of Patent: Jun. 18, 2024

(54) ELECTRIC DEVICE WITH HOUSING AND COVER

(71) Applicant: VALEO SIEMENS EAUTOMOTIVE GERMANY GMBH, Erlangen (DE)

(72) Inventors: Christof Bothor, Feucht (DE); Frank Roeder, Leipzig (DE); Christoph Hoyler, Kirchensittenbach (DE); Markus Reymann, Nuremberg (DE); Michael Tilp, Nuremberg (DE)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 95 days.

(21) Appl. No.: 17/120,728

(22) Filed: Dec. 14, 2020

(65) Prior Publication Data

US 2021/0195770 A1    Jun. 24, 2021

(30) Foreign Application Priority Data

Dec. 19, 2019    (DE) ...................... 10 2019 135 137.5

(51) Int. Cl.
*H05K 5/02* (2006.01)
*H05K 5/06* (2006.01)

(52) U.S. Cl.
CPC ............. *H05K 5/0208* (2013.01); *H05K 5/06* (2013.01)

(58) Field of Classification Search
CPC .......... H05K 5/0208; H05K 5/03; H05K 5/06; H05K 5/061
See application file for complete search history.

(56) References Cited

U.S. PATENT DOCUMENTS

| | | | |
|---|---|---|---|
| 2007/0115707 A1* | 5/2007 | Koide | .................. F04B 39/121 180/68.5 |
| 2011/0254611 A1 | 10/2011 | Volkmann | |
| 2018/0272343 A1 | 9/2018 | Buse | |

FOREIGN PATENT DOCUMENTS

EP    2624370 B1    9/2016

* cited by examiner

*Primary Examiner* — James Wu
(74) *Attorney, Agent, or Firm* — HAUPTMAN HAM, LLP

(57) ABSTRACT

An electrical device includes a housing including a receiving space in which electrical components of the device are arranged, a cover device including a first cover element and a second cover element, and a sensor unit including a magnetic element and a magnetic sensor, which is configured to provide a detection signal when the magnetic element is detected to be absent. The first cover element has a cut-out, and the second cover element is arranged such that the second cover element, in a first position, covers the cut-out and, in a second position, allows access to the cut-out. The cover device is arranged such that the cover device, in a first position, closes the receiving space when the second cover element is in the first position, and in a second position, allows access to the first sub-receiving space and the second sub-receiving space.

14 Claims, 3 Drawing Sheets

ELECTRIC DEVICE WITH HOUSING AND COVER

RELATED APPLICATIONS

The present application is based on, and claims priority from, German Application No. DE 10 2019 135 137.5 filed Dec. 19, 2019, the disclosure of which is hereby incorporated by reference herein in its entirety.

The present invention relates to an electrical device. In addition, the invention relates to a system comprising an electrical machine and an electrical device, as well as to a vehicle.

Electrical devices comprising a housing, having electrical components of the electrical system arranged in the receiving space thereof, are frequently provided with sensor units so as to detect whether a cover device closing the receiving space in a first position is transferred into a second position of the cover device allowing access to the receiving space. Corresponding detection signals can be evaluated by an interlock circuit, which de-energizes the components so as to prevent electric shock during inadvertent or unauthorized access to the energized components. In addition to mechanical contacts, which are closed in the first position and open in the second position, it has already been proposed to carry out a detection of the removal of the cover device by way of a sensor unit comprising a magnetic element and a magnetic sensor.

Document EP 2 624 370 B1, for example, discloses an electrical connector, which is intended to establish an electrical connection between at least one electrical conductor and an electrical circuit and comprising the following: a connection plate between the conductor and the electrical circuit, a cover intended to cover the plate so as to define a substantially closed space, and current interruption means intended to interrupt a current flowing in the plate when a distance between the plate and the cover is greater than a predefined value. For this purpose, the current interruption means comprises a Hall effect sensor, which detects a signal emitted by a magnetic surface, wherein the sensor is positioned at the connection plate, and the magnetic surface is positioned at the cover, or vice versa.

When access to the receiving space is required, for example for maintenance purposes, on such a device, the entire cover device has to be removed. This is laborious and makes it more difficult to service the electrical device.

It is therefore the object of the invention to provide a maintenance-friendly electrical device including a detection option for inadvertent or unauthorized access to the receiving space.

According to the invention, this object is achieved by an electrical device, comprising a housing including a receiving space in which electrical components of the device are arranged; a cover device comprising a first cover element and a second cover element, wherein the first cover element has a cut-out, and the second cover element can be arranged with respect to the first cover element in such a way that the second cover element, in a first position, covers the cut-out and, in a second position, allows access to the cut-out, wherein the cover device can be arranged with respect to the housing in such a way that the cover device, in a first position, closes the receiving space, when the second cover element is in the first position, and allows access to a first sub-receiving space of the receiving space through the cut-out and closes a second sub-receiving space of the receiving space when the second cover element is in the second position, and that the cover device, in a second position, allows access to the first sub-receiving space and the second sub-receiving space; and a sensor unit comprising a magnetic element and a magnetic sensor, which is configured to provide a detection signal when the magnetic element is detected to be absent, wherein the sensor unit is arranged and designed to detect the absence of the magnetic element in the second position of the second cover element and in the second position of the cover device.

The invention is based on the consideration of breaking the receiving space into two sub-receiving spaces, wherein maintenance-intensive components can be arranged in the first sub-receiving space, and less maintenance-intensive or low-maintenance components can be arranged in the second sub-receiving space. In addition, the cover device is formed by two cover elements, wherein the second cover element, in the second position, essentially only allows access to the first sub-receiving space through the cut-out in the first cover element. As a result, it is not necessary to remove the entire cover device to access the first receiving space, but only the smaller second cover element. The sensor unit is arranged in the process so as to provide a detection signal that can, for example, be evaluated by an interlock circuit both in the second position of the second cover element, and in the second position of the cover device, in which access to the entire receiving space is enabled. In the process, the magnetic sensor unit allows contactless detection, without having to run an electrical line through the first cover element for detecting the removal of the second cover element.

The device according to the invention thus only allows access to be gained to the first sub-receiving space through the removal of the second cover element, which increases the maintenance-friendly nature because it saves work steps. At the same time, the sensor unit provides a low-complexity detection option for inadvertent or unauthorized access to the receiving space.

It is preferred with respect to the device according to the invention when the magnetic element is arranged at or in the second cover element. In this way, it is possible to detect the absence of the magnetic element both when only the second cover element is removed, and also when the entire cover device is removed.

It is furthermore advantageous in the case of the device according to the invention when the sensor unit is designed in such a way that a field strength of the magnetic field of the magnetic element pervading the first cover element is detectable, in the first position of the second cover element, as the presence of the magnetic element, by means of the magnetic sensor. The absence of the magnetic element can thus be detected in a contactless manner through the first cover element, based on the magnetic field generated by the magnetic element.

In a preferred embodiment of the device according to the invention, it is furthermore provided that the first cover element has a depression which points toward the receiving space and in which the magnetic element is located in the first position of the second cover element. In this way, proper positioning of the magnetic element with respect to the magnetic sensor can advantageously be achieved, and an arrangement of the components inside the receiving space can be flexibly configured. The second cover element can include a protrusion, which engages in the depression in the first position of the second cover element.

In principle, it is preferred in the case of the device according to the invention when the magnetic sensor is arranged in the receiving space. In this way, electrical wiring of the magnetic sensor outside the receiving space can be dispensed with. The magnetic sensor is particularly preferably arranged in the second receiving space. This has the advantage that access to the magnetic sensor through the cover, and as a result also the manipulation thereof, is made more difficult.

However, it is nonetheless conceivable that it is provided in the device according to the invention that the magnetic sensor is arranged at or in the second cover element. The magnetic element can then be arranged in the receiving space, preferably in the second sub-receiving space. In this regard, it may also be provided that the first cover element has a depression which points toward the receiving space and in which the magnetic sensor is located in the first position of the second cover element.

The maintenance-friendly nature of the device according to the invention can furthermore be improved when an attachment means for releasably attaching one of the electrical components, preferably a fuse, is arranged in the first sub-receiving space. Fuses in particular are a good example of the aforementioned maintenance-intensive electrical components.

The device according to the invention can furthermore comprise a sealing element, which is designed to seal the housing with respect to the first cover element. The sealing element, which can also be referred to as a first sealing element, can be used to achieve a desired IP protection class of the device, for example. It is preferred in the process when the sealing element cannot be transferred without destruction from the first position into the second position. An adhesive seal is, for example, provided as a first sealing element, which advantageously enables high protection against ingress of water and/or dust into the receiving space in an effective and cost-efficient manner. Since the first cover element essentially covers the second sub-receiving space, which is provided for less maintenance-intensive electrical components, the lack of reversibility of the first sealing element practically does not impair the maintenance of the more maintenance-intensive components in the first sub-receiving space.

The device according to the invention can furthermore comprise a sealing element that is designed to seal the first cover element with respect to the second cover element. In this way, the desired IP protection class can also be implemented with respect to the two cover elements. This sealing element, which can also be referred to as a second sealing element, can preferably be transferred without destruction from the first position of the second cover element into the second position thereof. For example, the use of a silicone gasket or of an O-ring is an obvious choice for this purpose. The second sealing element is advantageously attached to the first cover element, and not to the second cover element, or is attached to the second cover element, and not to the first cover element. The sealing element typically extends along an edge of the cut-out when the second cover element is in the first position. As an alternative, the sealing element can extend along an outer contour of the second cover element. A further sealing element can be provided, which extends around the magnetic element arranged at the second cover element, or around the magnetic sensor arranged at the second cover element. In this way, the magnetic element can be protected against corrosion, for example.

It shall be noted in this regard that the sealing region of the first sealing element, which can be designed to be less complex than the second sealing element, is considerably larger than a sealing region of the second sealing element, which typically has a more complex design and is more cost-intensive.

In principle, it is preferred in the process when the magnetic element and the magnetic sensor are arranged outside a sealing region of the second sealing element.

In order to satisfy the high safety requirements when the device according to the invention is used in the automotive field, it may be provided that the sensor unit furthermore comprises a redundant magnetic sensor, which is configured to provide a further detection signal when the magnetic element is detected to be absent. As a result of this redundancy, a high safety level, for example ASIL B, can be achieved.

The device according to the invention advantageously furthermore comprises an interlock circuit, which is configured to de-energize the electrical components as a function of the detection signal or the detection signals. The interlock circuit can, for example, comprise a control unit, which is configured to evaluate the detection signal or the detection signals. In addition, the interlock circuit can comprise a switching unit, which is configured to de-energize an electrical connection to the electrical components as a function of the detection signal or the detection signals.

It can be provided that the sensor unit comprises a signal processing unit, which evaluates raw information of the magnetic sensor, and provides a conditioned detection signal. However, it may also be provided that the sensor unit is configured to provide raw data as detection signals, which can be evaluated by means of a signal processing unit of the interlock circuit.

The interlock circuit can furthermore be provided to comprise a line monitoring unit for a line carrying a supply voltage of the sensor unit, and to be configured to de-energize the electrical components as a function of a monitoring signal of the line monitoring unit which indicates an interruption in the supply voltage. Such a line monitoring unit, for example, makes it possible to dispense with the redundant magnetic sensor, without lowering the safety level, since a failure of the magnetic sensor is thus detectable.

In an advantageous embodiment, the device according to the invention is designed as an inverter.

The object underlying the invention is furthermore achieved by a system comprising an electrical machine and a device according to the invention, wherein the power converter is configured to provide a single-phase or polyphase alternating current for the electrical machine. Advantageously, it is provided that the electrical machine is configured to drive an electrically drivable vehicle.

The object underlying the invention is also achieved by a vehicle, comprising an electrical device according to the invention or a system according to the invention.

Further advantages and details of the present invention will be apparent from the exemplary embodiments described hereafter and based on the drawings. These are schematic illustrations. In the drawings:

FIG. 1 shows a perspective cut view of an exemplary embodiment of an electrical device 1.

Figure 1:
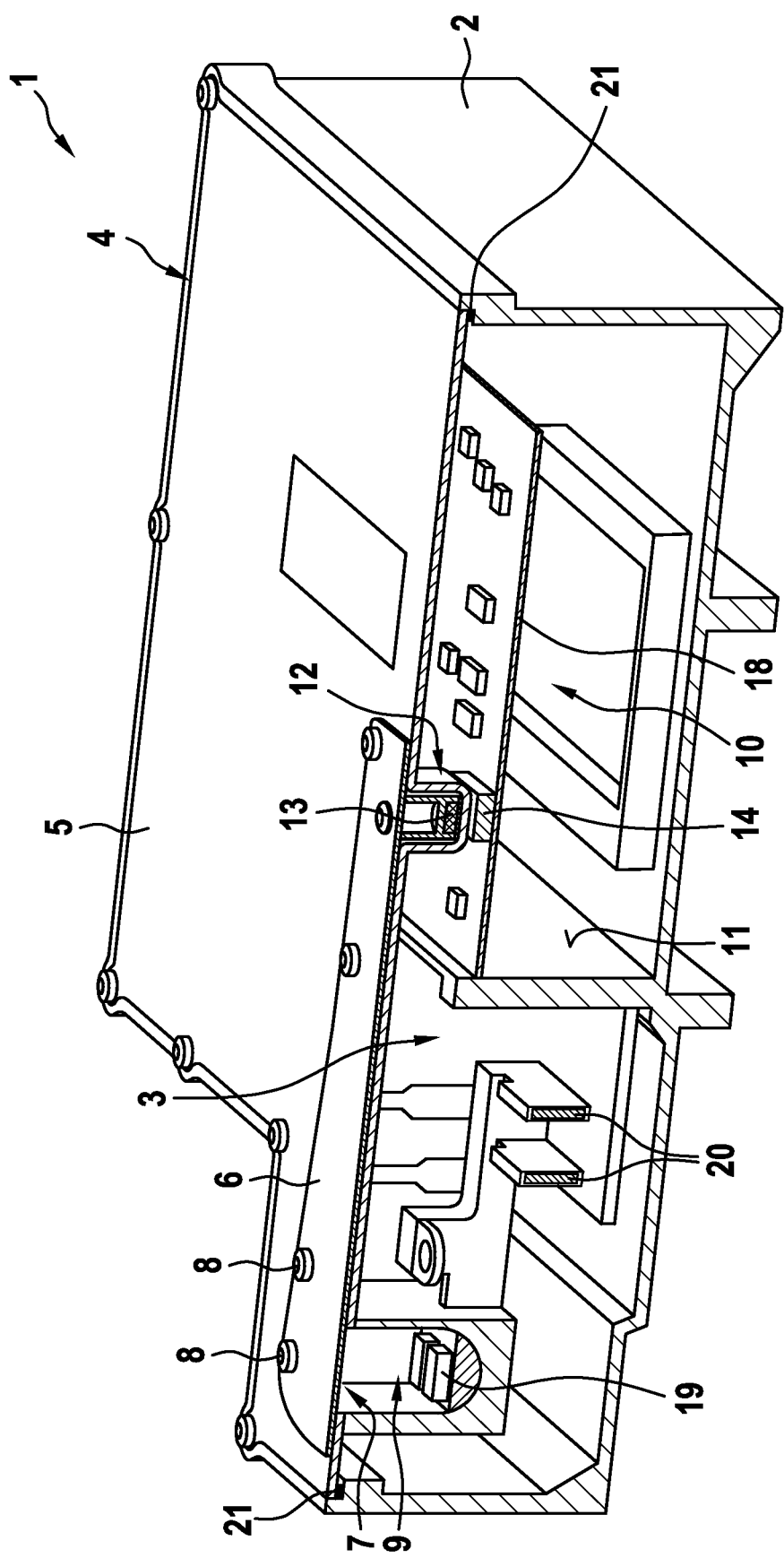
FIG. 1 shows a perspective cut view of an exemplary embodiment of the electrical device according to the invention.

The electrical device 1 comprises a housing 2, including a receiving space 3 in which electrical components of the device 1 are arranged. In addition, the device 1 comprises a cover device 4, which comprises a first cover element 5 and a second cover element 6. The first cover element 5 has a cut-out 7. The second cover element 6 can be arranged with respect to the first cover element 5 in such a way that the second cover element, in a first position, shown in FIG. 1, covers the cut-out 7 and, in a second position, allows access to the cut-out 7. In a second position, the second cover element 6 is removed from the first cover element 5, for example after removing attachment means 8, so that the cut-out 7 is exposed.

The cover device 4 itself can be arranged with respect to the housing 2 so as to close the receiving space 3, in a first position, shown in FIG. 1, when the second cover element 6 is in the first position. If, in contrast, the second cover element 6 is in the second position, and the cover device 4 is in the first position, access to a first sub-receiving space 9 is possible through the cut-out 7 in the first cover element 5, and a second sub-receiving space 10 is closed. The cover device 4 can furthermore be arranged so as to allow, in a second position, which is generally independent of the position of the second cover element 6, access to the first sub-receiving space 9 and the second sub-receiving space 10.

In this regard, it must be pointed out that the sub-receiving spaces 9, 10 in the present exemplary embodiment form the entire receiving space 3, even if the second sub-receiving space 10 is spatially further subdivided, for example by an inner wall 11 of the housing 2.

The electrical device 1 additionally comprises a sensor unit 12, comprising a magnetic element 13 and a magnetic sensor 14, which is configured to provide a detection signal 25 (see FIG. 4) when the magnetic element 13 is detected to be absent. The sensor unit is arranged and designed in such a way that the absence of the magnetic element 13 is detectable in the second position of the second cover element 6, and in the second position of the cover device 4.

Figure 2:
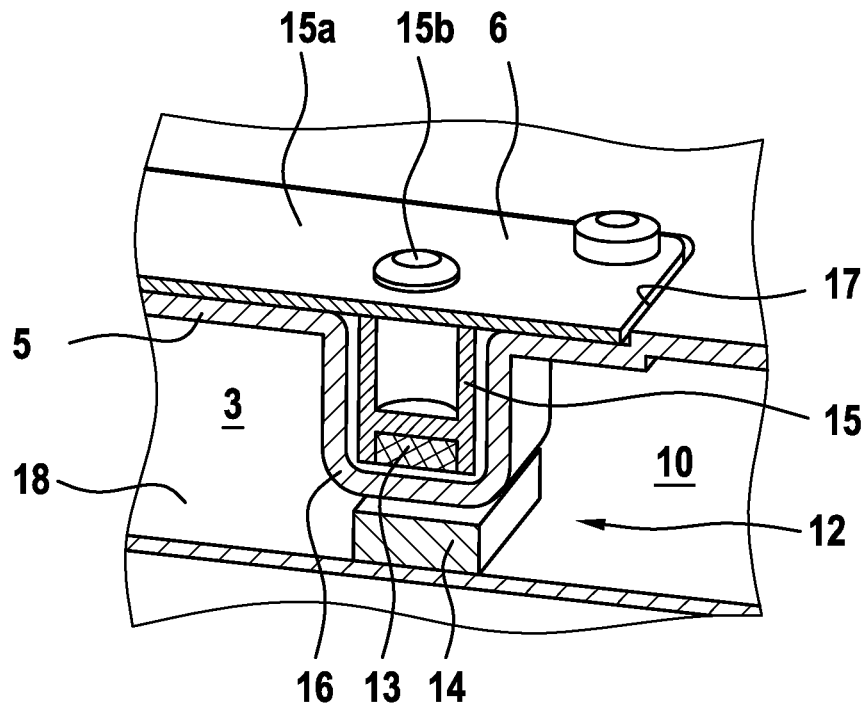
FIG. 2 shows a perspective cut detailed view of the exemplary embodiment in the region of the sensor unit.

FIG. 2 shows a cut detailed view of the device 1 according to the exemplary embodiment in the region of the sensor unit 12.

In the present example, the magnetic element 13 is designed as a permanent magnet and arranged at a protrusion 15 of the second cover element 6. The magnetic element 13 is framed at the edge by the protrusion 15, wherein it is also possible, as an alternative, for the magnetic element 13 to be framed completely by the protrusion 15 or to be otherwise integrated into the second cover element 6, and to thus be arranged in the second cover element 6. It is also conceivable for the magnetic element 13 to be formed by a magnetizable region of the second cover element 6.

The first cover element 5 has a depression 16 which points into the second sub-receiving region 10 and in which the magnetic element 13 is located in the first position of the second cover element 6. For this purpose, the protrusion 15 engages in the depression 16, wherein the second cover element 6, in the first position, rests on the first cover element 5.

The protrusion 15 is designed here in two pieces with a body 15a of the second cover element 6, and attached by an attachment means 15b to the body 15a. As an alternative, it is also possible for the protrusion 15 to be designed in one piece with the body 15a. It is also apparent that the first cover element 5, on the side thereof facing away from the receiving space 3, includes a recess 17, which corresponds to the shape of the body 15a of the second cover element 6.

The magnetic sensor 14 is arranged in the second sub-receiving space 10. In the present example, the magnetic sensor 14 is arranged on a printed circuit board 18, on which some of the electrical components of the device 1 are mounted. As a result of the protrusion 15 and the depression 16, the arrangement of the sensor unit 12 can be adapted to a mounting height of the printed circuit board 18 in the receiving space 3. The sensor unit 12 is thus designed in such a way that a field strength of the magnetic field of the magnetic element 13 pervading the first cover element 5 is detectable, in the first position of the second cover element 6, as a presence of the magnetic element 13 by means of the magnetic sensor 14.

With reference to FIG. 1 again, it is apparent that an attachment means 19 for releasably attaching an electrical component, a fuse here (not shown), is arranged in the first sub-receiving space 9. The component arranged in the first sub-receiving space 9 is generally a maintenance-intensive component, which has to be accessed more frequently in the event of service than components arranged in the second sub-receiving space 10.

By way of example, the electrical device 1 is designed as an inverter in the present exemplary embodiment so that, for example, bus bars 20 of a DC voltage side of the inverter are arranged in the second sub-receiving space 10. Some of the components arranged on the printed circuit board 18 are those of a control unit of the inverter. In general, no access for maintenance is required to the components in the second sub-receiving space 10, so that the detection of a transfer of the cover device 4 from the first position into the second position is essentially used to detect unauthorized or inadvertent access to high voltage components, such as the bus bars 20.

The device 1 furthermore comprises a first sealing element 21, which is designed to seal the housing 2 with respect to the first cover element 5. This sealing element is an adhesive seal, which cannot be transferred without destruction from the first position of the cover device 4 into the second position thereof. However, a required IP protection class can be implemented in a low-complexity and effective manner by the adhesive seal. With respect to only low-maintenance components being arranged in the second sub-receiving space 10 anyhow, it is not provided anyhow that the entire cover device 4 is removed in the event of service work.

Figure 3:
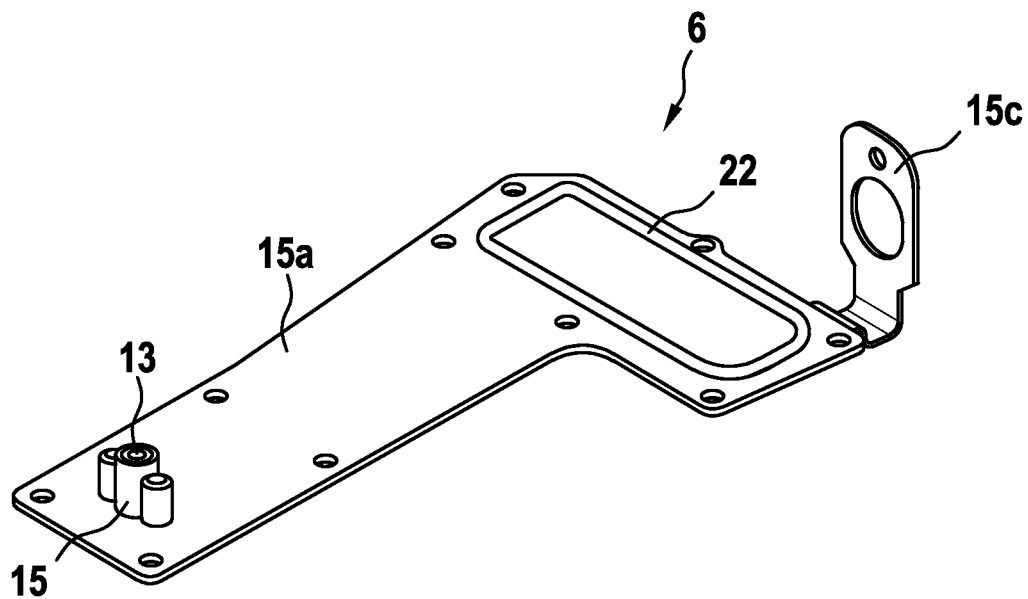
FIG. 3 shows a perspective view of the second cover element according to the exemplary embodiment.

FIG. 3 shows a perspective view of the second cover element 6, with a view of the side thereof facing the first cover element 5.

In addition to the protrusion 15 including the magnetic element 13 and the body 15a, furthermore a mounting lug 15c, which projects at an angle from the body 15a, is shown at the second cover element 6 or the body 15a thereof. In addition, a second sealing element 22 of the device 1, which arranged at the second cover element 6 or the body 15a thereof, is shown.

The second sealing element 22 is designed to seal the first cover element 5 with respect to the second cover element 6 and can be transferred without destruction from the first position of the second cover element 6 into the second position thereof. In the present example, the second sealing element 22 is designed as a silicone seal and only attached to the second cover element 6. The second sealing element 22 is consequently reversible, in contrast to the first sealing element 21. As is apparent, the second sealing element 22, in the first position, extends from the cut-out 7 so that the magnetic element 13 is located outside a sealing region of the second sealing element 22. As an alternative, it can be provided that the second sealing element 22 extends along an outer contour of the second cover element 6.

In further exemplary embodiments, the second sealing element 22 is designed as an O-ring. It is also possible for another sealing element to be provided, which extends at the second cover element 6 or at the first cover element 5 around the magnetic element 13, so as to protect it against corrosion.

Figure 4:
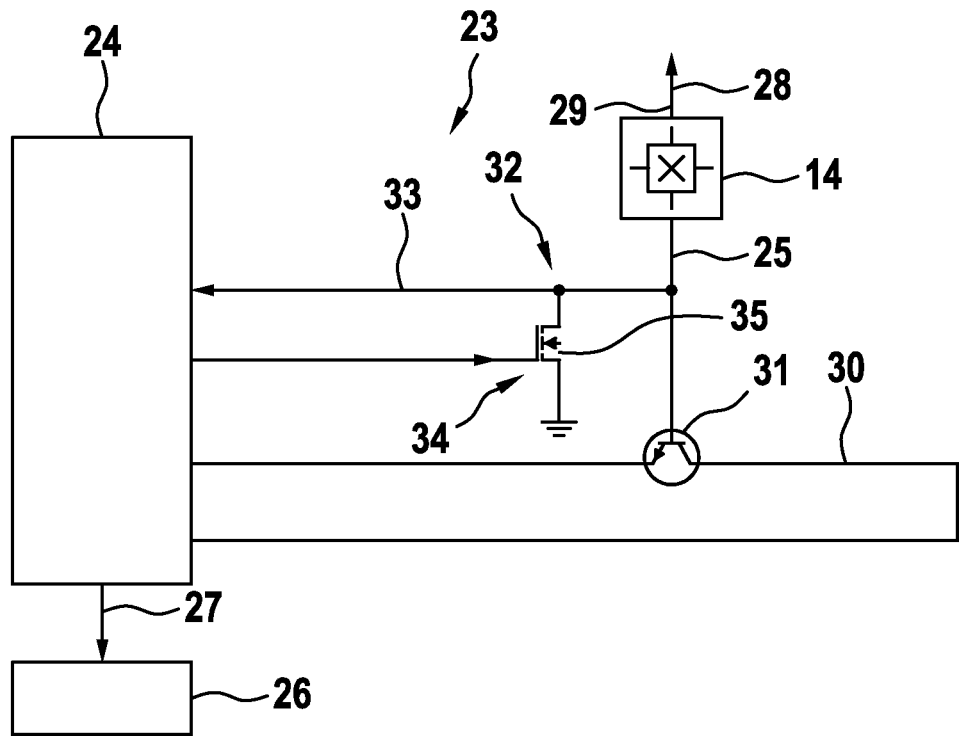
FIG. 4 shows a block diagram of the interlock circuit according to the exemplary embodiment.

FIG. 4 shows a block diagram of an interlock circuit 23 of the device 1.

The interlock circuit 23 comprises a control unit 24, which is configured to de-energize the electrical components as a function of the detection signal 25 of the magnetic sensor 14. For this purpose, the interlock circuit 23 comprises a switching unit 26, which can be activated by the control unit 24 and is configured to de-energize an electrical connection to the electrical components as a function of a control signal 27 of the control unit 24.

The interlock circuit 23 comprises a line 29 carrying a supply voltage 28 of the magnetic sensor 14, which is also used here to transmit the detection signal 25. In addition, a conductor loop 30, to which a switching element 31 is connected, is provided on the interlock circuit 23. The switching element 31 is configured to interrupt and close the conductor loop 30 as a function of the detection signal 20. In the process, a removal of the cover device 4 from the housing 2, that is a transfer from the first position into the second position, or a removal of the second cover element 6, that is a transfer from the first position into the second position, is inferred from an interruption in the conductor loop 30. This means that the control unit 24 outputs the control signal 27 in the event of an interruption in the conductor loop 30. Further switching elements 31 or conventional conductor bridges for monitoring other locations of the device 1 with respect to an unauthorized or inadvertent opening of a cover can be connected into the conductor loop 30.

Moreover, the interlock circuit 23 comprises a line monitoring unit 32, which is configured to de-energize the electrical components as a function of a monitoring signal 33 indicating an interruption in the supply voltage. For this purpose, the control unit 24 detects a drop in a voltage on the line 29, and in this case likewise outputs the control signal 27. Since such a failure of the magnetic sensor 14 is identifiable, the interlock circuit 23 satisfies a safety level according to ASIL B.

FIG. 4 furthermore shows a diagnostic function 34 of the line monitoring unit 32, which comprises a switching element 35 activatable by the control unit 24. As a result of the switching element 35, the line 29 can be connected to ground for diagnostic purposes of the line monitoring unit 32.

According to a further exemplary embodiment, in which the line monitoring unit 32 can be dispensed with for implementing a safety level according to ASIL B, the sensor unit 12 comprises a redundant magnetic sensor. This provides a further detection signal when the magnetic element 13 is detected to be absent. For this purpose, the interlock circuit 23 can comprise a further switching element, for example, which is connected to the conductor loop 30 in series with the switching element 31 and disconnects the loop as a function of the further detection signal. In this way, it is ensured that the components are already de-energized when a detection signal of one of the two magnetic elements is present.

Figure 5:
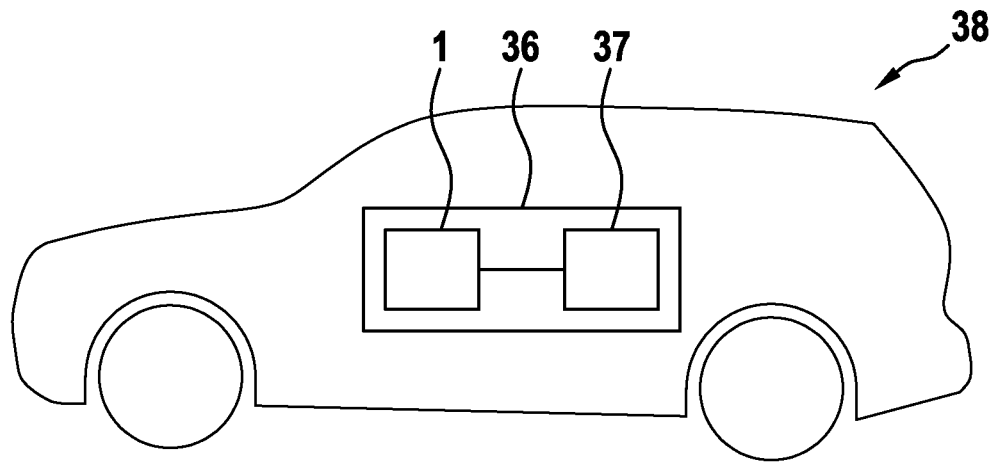
FIG. 5 shows a schematic diagram of an exemplary embodiment of the vehicle according to the invention comprising the system according to the invention.

FIG. 5 shows a schematic diagram of an exemplary embodiment of a vehicle 38, which comprises an exemplary embodiment of a system 36 comprising an electrical machine 37 and an electrical device 1 according to one of the above-described exemplary embodiments. The device 1 is designed as an inverter, which is configured to provide an alternating current, a three-phase alternating current here, for the electrical machine 37. The electrical machine 37 is configured to drive the vehicle 38, for example an electric vehicle (BEV) or a hybrid vehicle.

The invention claimed is:

1. An electrical device, comprising:
   a housing including a receiving space in which electrical components of the electrical device are arranged, the receiving space having a first sub-receiving space and a second sub-receiving space;
   a cover device comprising a first cover element having a cut-out therein, and a second cover element, wherein the second cover element is arranged with respect to the first cover element in such a way that the second cover element, in a first position, covers the cut-out and, in a second position, allows access to the cut-out, wherein the cover device is arranged with respect to the housing in such a way that the cover device, in a first position, closes the receiving space when the second cover element is in the first position, and allows access to the first sub-receiving space of the receiving space through the cut-out and closes the second sub-receiving space of the receiving space when the second cover element is in the second position, and that the cover device, in a second position, allows access to the first sub-receiving space and the second sub-receiving space; and
   a sensor unit comprising a magnetic element and a magnetic sensor, which is configured to provide a detection signal when the magnetic element is detected to be absent, wherein the sensor unit is arranged and designed to detect an absence of the magnetic element in the second position of the second cover element and in the second position of the cover device,
   wherein a fuse is arranged in the first sub-receiving space.

2. The electrical device according to claim 1, wherein the magnetic element is arranged to be covered by the second cover element.

3. The electrical device according to claim 1, wherein the sensor unit is designed in such a way that a field strength of a magnetic field of the magnetic element pervading the first cover element is detectable, in the first position of the second cover element, as a presence of the magnetic element, by means of the magnetic sensor.

4. The electrical device according to claim 1, wherein the first cover element has a depression which points toward the receiving space and in which the magnetic element is located in the first position of the second cover element.

5. The electrical device according to claim 1, wherein the magnetic sensor is arranged in the second sub-receiving space.

6. The electrical device according to claim 1, further comprising:
   a sealing element which is designed to seal the housing with respect to the first cover element and cannot be transferred without destruction from the first position into the second position of the cover device.

7. The electrical device according to claim 1, further comprising:
   a sealing element which is designed to seal the first cover element with respect to the second cover element and can be transferred without destruction from the first position into the second position of the second cover element.

8. The electrical device according to claim 7, wherein the magnetic element and the magnetic sensor are arranged outside a sealing region of the sealing element.

9. The electrical device according to claim 1, further comprising:
an interlock circuit, which is configured to de-energize the electrical components as a function of the detection signal or detection signals.

10. The electrical device according to claim 9, wherein the interlock circuit comprises a line monitoring unit for a line carrying a supply voltage of the sensor unit and is configured to de-energize the electrical components as a function of a monitoring signal of the line monitoring unit which indicates an interruption in the supply voltage.

11. The electrical device according to claim 1, which is designed as an inverter.

12. A system, comprising an electrical machine and the electrical device according to claim 11, wherein the inverter is configured to provide a single-phase or polyphase alternating current for the electrical machine.

13. A vehicle comprising the electrical device according to the system according to claim 12.

14. A vehicle comprising the electrical device according to claim 1.

* * * * *